United States Patent [19]

Kanai

[11] Patent Number: 4,830,890
[45] Date of Patent: May 16, 1989

[54] METHOD FOR FORMING A DEPOSITED FILM FROM A GASEOUS SILANE COMPOUND HEATED ON A SUBSTRATE AND INTRODUCING AN ACTIVE SPECIES THEREWITH

[75] Inventor: Masahiro Kanai, Tokyo, Japan
[73] Assignee: Canon Kabushiki Kaisha, Tokyo, Japan
[21] Appl. No.: 944,359
[22] Filed: Dec. 22, 1986
[30] Foreign Application Priority Data Dec. 24, 1985 [JP] Japan ................. 60-291062

[51] Int. Cl.⁴ .......................... C23C 16/22
[52] U.S. Cl. ................. 427/255.1; 427/255; 427/255.2; 437/225
[58] Field of Search ............ 427/248.1, 255.1, 255.2, 427/85, 86, 87, 95, 249, 255, 255.3; 437/225

[56] References Cited

U.S. PATENT DOCUMENTS

| | | | |
|---|---|---|---|
| 3,473,978 | 10/1969 | Jackson et al. | 427/248.1 |
| 3,825,439 | 7/1974 | Tick | 427/255.2 |
| 3,916,034 | 10/1975 | Tsuchimoto | 427/38 |
| 4,077,818 | 3/1978 | Chu | 427/249 |
| 4,084,024 | 4/1978 | Schumacher | 427/248.1 |
| 4,217,374 | 8/1980 | Ovshinsky et al. | 427/39 |
| 4,220,488 | 9/1980 | Duchemin et al. | 148/175 |
| 4,282,267 | 8/1981 | Kuyel | 428/38 |
| 4,402,762 | 9/1983 | John et al. | 148/1.5 |
| 4,410,559 | 10/1983 | Hamakawa et al. | 427/39 |
| 4,419,381 | 12/1983 | Yamazaki | 427/39 |
| 4,430,185 | 2/1984 | Shimomoto et al. | 427/39 |
| 4,434,188 | 2/1984 | Kamo et al. | 427/39 |
| 4,439,463 | 3/1984 | Miller | 427/39 |
| 4,448,801 | 5/1984 | Fukuda et al. | 427/39 |
| 4,450,185 | 5/1984 | Shimizu et al. | 427/39 |
| 4,461,783 | 7/1984 | Yamazaki | 427/39 |
| 4,466,992 | 8/1984 | Dreiling | 427/39 |
| 4,468,413 | 8/1984 | Bachmann | 427/39 |
| 4,468,443 | 8/1984 | Shimizu et al. | 430/60 |
| 4,471,042 | 9/1984 | Komatsu et al. | 430/64 |
| 4,485,125 | 11/1984 | Izu et al. | 427/74 |
| 4,504,518 | 3/1985 | Ovshinsky et al. | 427/38 |
| 4,514,437 | 4/1985 | Nath | 427/39 |
| 4,517,223 | 5/1985 | Ovshinsky et al. | 427/39 |
| 4,521,447 | 6/1985 | Ovshinsky et al. | 427/45.1 |
| 4,522,663 | 6/1985 | Ovshinsky et al. | 427/39 |
| 4,526,805 | 7/1985 | Yashizawa | 427/38 |
| 4,532,199 | 7/1985 | Ueno et al. | 427/39 |
| 4,543,267 | 9/1985 | Yamazaki | 427/45.1 |
| 4,544,423 | 10/1985 | Tsuge et al. | 427/39 |
| 4,546,008 | 10/1985 | Saitoh et al. | 427/38 |
| 4,554,180 | 11/1985 | Hirooka | 427/248.1 |
| 4,564,533 | 1/1986 | Yamazaki | 427/39 |
| 4,564,997 | 1/1986 | Matsuo et al. | 427/39 |
| 4,567,127 | 1/1986 | Saitoh et al. | 430/65 |
| 4,569,697 | 2/1986 | Tsu et al. | 427/51 |
| 4,582,560 | 4/1986 | Sanjurjo | 156/613 |
| 4,615,905 | 10/1986 | Ovshinsky | 427/39 |
| 4,657,777 | 4/1987 | Hirooka | 427/39 |
| 4,664,937 | 5/1987 | Ovshinsky et al. | 427/39 |
| 4,689,093 | 8/1987 | Ishihara et al. | 427/39 |

FOREIGN PATENT DOCUMENTS

| | | | |
|---|---|---|---|
| 0074212 | 3/1983 | European Pat. Off. | 118/715 |
| 0090586 | 10/1983 | European Pat. Off. | 427/38 |
| 57-66625 | 4/1982 | Japan | 427/38 |
| 59-199035 | 4/1983 | Japan | 427/38 |
| 2038086 | 7/1980 | United Kingdom | 427/87 |
| 2148328 | 5/1985 | United Kingdom | 427/255.2 |

OTHER PUBLICATIONS

Brodsky et al., 22, IBM Technical Disclosure Bulletin, 3391, (Jan. 1980).
Janai et al., 52, J. Appl. Phys., 3622, (May 1981).

Primary Examiner—Sadie Childs
Attorney, Agent, or Firm—Fitzpatrick, Cella, Harper & Scinto

[57] ABSTRACT

A process for forming a deposited film which comprises introducing a linear, branched or cyclic gaseous silane compound represented by a general formula:

$$Si_xH_yX_z$$

wherein X stands for a halogen atom, x is an integer 3, 4, 5 or 6, and $y+z=2x$ or $2x+2$; into a film forming space for forming a deposited film on a substrate, activating said silane compound on the surface of the heated substrate to generate a precursor functioning as a raw material for forming the deposited film, generating an active species capable of an interaction with said precursor in a separate activating space, and introducing said active species into the film forming space to form a deposited film on said substrate.

6 Claims, 3 Drawing Sheets

METHOD FOR FORMING A DEPOSITED FILM FROM A GASEOUS SILANE COMPOUND HEATED ON A SUBSTRATE AND INTRODUCING AN ACTIVE SPECIES THEREWITH

BACKGROUND OF THE INVENTION

1. Field of the Invention

The present invention relates to a method suitable for forming a deposited film, particularly a functional film, and more particularly an amorphous or crystalline deposited film adapted for use in semiconductor devices, electrophotographic photosensitive devices, image reading line sensors, image pickup devices, photoelectric elements or the like.

2. Related Background Art

As an example, for formation an amorphous silicpn film, various methods have been tried methods such as vacuum deposition, plasma CVD, CVD, the reactive sputtering, ion plating, photochemical vapor deposition etc. Generally, the plasma CVD method has been widely used and industrialized.

However, such deposited film of amorphous silicon still needs to be improved in their electrical and optical properties, fatigue characteristic due to repeated use, resistance to environmental conditions, productivity, and mass producibility including uniformity and reproducibility.

The reaction process in the plasma CVD process commonly used up to now in the formation of an amorphous silicon film is considerably more complex in comparison with that of the conventional CVD process, and has not fully been analyzed. Also the deposited film formation involves various parameters such as the substrate temperature, flow rates and ratio of introduced gases, pressure during film deposition, high-frequency electric power, structure of electrodes, structure of reactor vessel, rate of gas discharge, method of plasma formation etc. of which adjusting a combination thereof often results in an unstable plasma or undesirable effects on the formed film. Besides, since each apparatus has its own specific parameters, it is difficult to generalize the production conditions.

On the other hand, the plasma CVD method is presently considered best for forming an amorphous silicon film having electrical and optical properties for various applications.

However, for certain applications requiring reproducible mass production of a large area with uniform thickness and quality, the plasma CVD method requires a significant investment in equipment. Use of such equipment is inevitably concerned with complex items of control, narrower tolerances and delicate adjustments. For this reason improvements on these points have been longed for.

On the other hand, the conventional CVD process requires a high temperature, and is unable to produce a deposited film having substantially acceptable properties.

In this manner, there has been desired a process for forming an amorphous silicon film with an inexpensive apparatus while maintaining substantially acceptable properties and uniformity.

For avoiding such drawbacks of the plasma CVD process, there is already proposed a novel process of activating a material for film formation in a separate "activating space" to obtain an active species, and introducing said active species alone into a film forming space for effecting film formation.

However, since such process generally employs a commercially available and relatively stable lower order silane compound such as $SiF_4$ or $Si_2F_6$ as the material for producing a precursor for film formation in the activating space, such process requires a relatively large excitation energy such as electrical energy obtained for example by microwave, high-frequency current or DC current, thermal energy obtained for example by resistor heating or high-frequency heating or optical energy. Consequently, in this process it is difficult to improve the efficiency of activation beyond a certain point, as well as requiring further improvements in terms of the amount of energy required and the efficiency of consumption of the raw material gas, in order to achieve mass production with a low cost in a simple apparatus.

SUMMARY OF THE INVENTION

In consideration of the foregoing, the object of the peesent invention is to provide a process for forming a deposited film, capable of significantly improving the consumption efficiency of the raw material gas and simplifying the film forming equipment by activating a raw material gas for film formation directly on a heated substrate to generate a precursor.

The above-mentioned object can be achieved, according to the present invention, by a process of introducing a linear, branched or cyclic gaseous silane compound represented by a general formula:

$$Si_xH_yX_z$$

wherein X stands for a halogen atom, x is an integer 3, 4, 5 or 6, and $y+z=2x$ or $2x+2$; into a film forming space for forming a deposited film on a substrate, activating said silane compound on the surface of the heated substrate thereby generating a precursor functioning as a material for film formation, also generating an active species capable of an interaction with said precursor in a separate activating space, and introducing said active species into the film forming space to formed a deposition film on said substrate.

DETAILED DESCRIPTION OF THE PREFERRED EMBODIMENTS

Due to the absence of plasma in the film forming space for forming a desired deposition film, the film forming parameters of the process of the present invention are limited to the amounts of the introduced raw material gases for forming a deposited film and the active species, substrate temperature and pressure in the film forming space. Consequently, the cohtrol of the conditions for film formation becomes easier, and the deposited film can be mass produced in reproducible manner.

In the present invention, the term of "precursor" means a substance capable of functioning as a raw material of the film to be formed. On the other hand, the term of "active species" means a substance capable of causing a chemical interaction with said precursor, thereby giving energy to the precursor or chemically reacting therewith, to render the precursor capable of more effectively forming the deposited film. Consequently, the active species may or may not contain a component constituting the film to be deposited.

In the present invention, the active species introduced from the activating space A into the film forming space has a life 10 seconds or less, preferably 5 seconds or less, and most preferably 2 seconds or less. At the formation of deposited film in the film forming space, said active species interacts chemically with said precursor containing a component which becomes a principal constitutent of the film to be deposited. Thus, a desired film can be easily deposited on a desired substrate.

Since the deposited film obtained according to the process of the present invention is formed without using plasma in the film forming space, the deposited film is substantially free from the undesirable influence of etching or abnormal discharge. Also the present invention can provide a more stable CVD process through the control of the temperature of the atmosphere in the film forming space and the substrate temperature.

The process of the present invention is different from the conventional CVD process in that it employs a linear, branched or cyclic gaseous silane compound which can be activated at a low temperature and which is represented by a general formula $Si_xH_yX_z$ wherein X is a halogen atom, x is an integer 3, 4, 5 or 6, and $y+z=2x$ or $2x+2$, to generate a precursor functioning as a raw material for the film to be formed on the surface of a substrate. An active species capable of a chemical interaction with said precursor is generated in a space separate from the film forming space and is introduced into the film forming space to interact with the precursor to form a deposited film on the substrate. In this manner, it is rendered possible to obtain a deposited film of a higher quality than that in the conventional CVD process, with a significantly higher deposition speed and at a lower substrate temperature. Thus, a deposited film of a stable quality can be obtained in industrial quantity with a lower cost.

The halogen atom contained in the silane compound $Si_xH_yX_z$ employed in the present invention can be F, Cl, Br or I, preferably F or Cl.

The number y of the hydrogen atoms contained in the silane compound $Si_xH_yX_z$ employed in the present invention is suitably determined by the number x of the silicon atoms constituting said silane compound. It is preferably in a range of $0 \leq y \leq 2x-2$ if $y+z=2x$, or $0 \leq y \leq 2x$ if $y+z=2x+2$, and most preferably in a range of $0 \leq y \leq 2x-4$ if $y+z=2x$, or $0 \leq y \leq 2x-2$ if $y+z=2x+2$.

In a silane compound ($Si_xH_yX_z$), the Si-Si dissociation energy becomes lower as the molecular structure becomes longer while the Si-halogen bonding energy is higher, particularly for F or Cl. Consequently, said silane compound $Si_xH_yX_z$ can be decomposed at lower temperature than that in silane compounds such as $SiH_4$, $SiF_4$, $Si_2H_6$ or $Si_2F_6$ and generates therefore radicals such as :SiHX constituting a precursor for forming an amorphous silicon film of a high quality.

The silane compounds $Si_xH_yX_z$ employed in the present invention have to be activated on the surface of the heated substrate, and the substrate temperature is preferably in a range from 50° to 700° C., more preferably from 80° to 500° C., and most preferably from 100° to 350° C., in order to prevent thermal deterioration or thermal deformation of the substrate and to obtain amorphous silicon film of satisfactory quality.

The silane compounds $Si_xH_yX_z$ employed in the present invention are activated only on the surface of the heated substrate. Consequently, a local formation of the deposited film is possible by locally heating the substrate where the deposited film is required. Also, even if the substrate has a very large area, a deposited film of uniform quality can be obtained by heating entirely the substrate.

Representative silicon skeleton structures of the silane compounds $Si_xH_yX_z$ advantageously employed n the present invention are shown in the following:

Examples of the material that can be introduced into the activating space A for generating the active species in the present invention are $H_2$, $SiH_4$, $SiH_3F$, $SiH_3Cl$, $SiH_3Br$, $SiH_3I$, and a rare gas such as He or Ar.

In the present invention, the active species is generated in the activating space A by means of a suitable activation energy, such as an electrical energy with a microwave, a high-frequency current, a low-frequency current or a DC current, a thermal energy by a heater or an infrared heating, or a light energy, taking various conditions and apparatuses in consideration. In case there are employed plural gasses for film formation, they can be introduced into the activating space either as a premixture or independently from separate feeding sources.

In the present invention, a catalyst may be employed in addition to the above-mentioned activation energy.

Examples of such catalyst are preferably transition metals, non-transition metals, alloys thereof, and oxides thereof.

More specifically, there can be employed Ti, Nb, Cr, Mo, W, Fe, Ni, Co, Rh, Pd, Mn, Ag, Zn, Cd, Na, K, Li, Pd-Ag, Ni-Cr, $TiO_2$, NiO, $V_2O_5$, and the like.

For activation, said catalyst may be directly heated by resistance heating through a current supply to said catalyst, or indirectly heated with an electric furnace or an infrared furnace incorporating a quartz tube filled with said catalyst.

Said catalyst can be formed as granules, or fine metallic particles deposited on an inorganic porous carrier, a filament, a mesh, a tube or a honeycomb, and one of such forms can be suitably selected to control the cross section of generating the active species, thereby controlling the reaction between the precursor and the active species and achieving the formation of a uniform deposited film.

Figure 1:
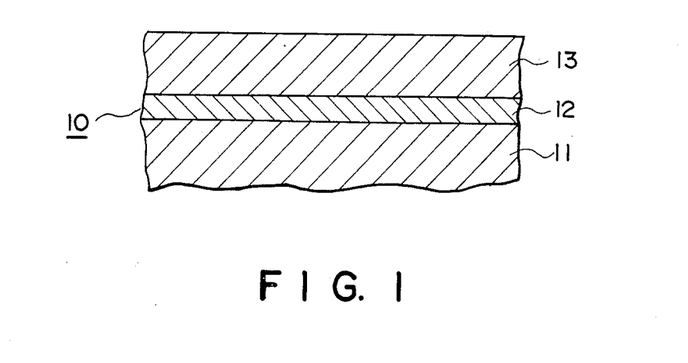
FIG. 1 is schematic view of an example of an electrophotographic image forming member obtained by the process of the present invention.

In the following, the present invention will be clarified further by a representative example of the formation of an electrophotographic image forming member according to the process of the present invention. FIG. 1 schematically shows the structure of a representative photoconductive member obtainable with the process of the present invention.

The photoconductive member 10 shown in FIG. 1, applicable as an electrophotographic image forming member, has a layer structure comprising a substrate 11, an eventual intermediate layer 12, and a photosensitive layer 13.

The substrate 11 can be electroconductive or electrically insulating. A conductive substrate can be composed of a metal such as NiCr, stainless steel, Al, Cr, Mo, Au, Ir, Nb, Ta, V, Ti, Pt or Pd, or an alloy thereof.

An insulating substrate can be composed of a plastic film or sheet composed, for example, of polyester, polyethylene, polycarbonate, cellulose acetate, polypropylene, polyvinyl chloride, polyvinylidene chloride, polystyrene or polyamide, glass, ceramics or paper. Such insulating substrate is preferably rendered electroconductive at least one surface thereof, and is desirably provided with other layers on said conductive surface.

For example, a glass substrate is rendered surfacially conductive by forming, on a surface thereof, a thin layer of NiCr, Al, Cr, Mo, Au, Ir, Nb, Ta, V, Ti, Pt, Pd, $In_2O_3$, $SnO_2$, ITO ($In_2O_3 + SnO_2$) or the like. Also a plastic film such as a polyester film is rendered surfacially conductive by vacuum deposition, electron beam deposition, sputtering or lamination with a metal such as NiCr, Al, Ag, Pb, Zn, Ni, Au, Cr, Mo, Ir, Nb, Ta, V, Ti or Pt. Said substrate can be arbitrarily formed as a cylinder, a belt or a plate according to the application. It is preferably formed as an endless belt or a cylinder if the photoconductive member 10 shown in FIG. 1 is used as an electrophotographic image forming member for continuous high-speed copying.

The intermediate layer 12 has a function of effectively preventing the entry of carriers from the substrate 11 to the photosensitive layer 13, and allowing easily the movement of photocarriers, generated in the photosensitive layer 13 by irradiation with an electromagnetic wave, from said layer 13 into the substrate 11.

Said intermediate layer 12 is composed of amorphous silicon containing hydrogen atoms (H) and/or halogen atoms (X), represented as A-Si(H, X), and further contains, as a material for regulating the electroconductivity, a p-type impurity such as boron (B) or an n-type impurity such as phosphor (P).

In the present invention, the amount of such conductivity regulating material such as B or P in the intermediate layer 12 is preferably in a range of $0.001 - 5 \times 10^4$ atomic ppm, more preferably $0.5 - 1 \times 10^4$ atomic ppm, and most preferably $1 - 5 \times 10^3$ atomic ppm.

The formation of the intermediate layer 12 can be continuously followed by the formation of the photosensitive layer 13. In such case, a silane compound $Si_xH_yX_z$ gas for forming the intermediate layer is introduced, eventually mixed with a diluting gas such as He or Ar with a predetermined ratio, into the film forming space containing a heated substrate 11 to generate the precursor on the surface thereof. Also into the activating space A, there is introduced a hydrogen-containing gas, eventually together with a compound containing an impurity element, to generate an active species eventually under the influence of catalyst, and said active species is introduced into the film forming spac to form the intermediate layer 12 on said substrate 11.

Examples of the effective starting material to be introduced into the activating space A for generating the active species for forming the intermediate layer 12 include $H_2$; Si-H compounds such as $SiH_4$; hydrogen-rich halosilanes such as $SiH_3Cl$, $SiH_3F$ or $SiH_3Br$; gaseous or gasifiable nitrogen compounds, nitrides and azides containing N atoms or N and H atoms such as nitrogen ($N_2$), ammonia ($NH_3$), hydrazine ($H_2NNH_2$), hydrogen azide ($HN_3$) or ammonium azide ($NH_4N_3$): hydrocarbons containing C and H atoms, for example, saturated hydrocarbons having 1–5 carbon atoms such as methane ($CH_4$), ethane ($C_2H_6$), propane ($C_3H_8$), n-butane (n-$C_4H_{10}$) or pentane ($C_5H_{12}$); ethylenic hydrocarbons having 2–5 carbon atoms such as ethylene ($C_2H_4$), propylene ($C_3H_6$), 1-butene ($C_4H_8$), 2-butene ($C_4H_8$), isobutylene ($C_4H_8$) or pentene ($C_5H_{10}$); acetylenic hydrocarbons having 2–4 carbon atoms such as acetylene ($C_2H_2$), methylacetylene ($C_3H_4$) or butyne ($C_4H_6$): oxygen ($O_2$); ozone ($O_3$); carbon monoxide (CO); carbon dioxide ($CO_2$); nitrogen monoxide (NO); nitrogen dioxide ($NO_2$); dinitrogen monoxide ($N_2O$); and the like.

Such starting material for forming the intermediate layer 12 is suitably selected at the layer formation in such a manner that desired atoms are included as constituents in the intermediate layer 12.

The thickness of the intermediate layer 12 is preferably in a range of 30 to 1000 Å, more preferably 50 to 600 Å.

The photosensitive layer 13 is composed, for exhibiting photoconductivity suitable for an electrophotographic image forming member, of amorphous silicon A-Si(H, X) which is composed of silicon atoms as matrix and contains halogen atoms (X) eventually combined with hydrogen atoms (H).

Also in forming the photosensitive layer 13, a silane compound $Si_xH_yX_z$ is introduced into the film forming space containing the heated substrate 11 and is excited and decomposed on the surface thereof to generate a precursor, in the same manner as in the formation of the intermediate layer 12. On the other hand, a starting gas such as $H_2$, $SiH_4$ or $SiH_3F$ is introduced into the activating space A and generates an active species, eventually under the function of a catalyst. Said active species is introduced into the film forming space and causes a chemical interaction with the precursor generated on the surface of the substrate, thereby depositing a desired photosensitive layer 13. The thickness thereof is suitably determined according to the purpose of use.

The thickness of the photosensitive layer 13 shown in FIG. 1 is suitably determined in relation to the thickness of the intermediate layer 12 in such a manner that said both layers 12 and 13 respectively function effectively, and is usually several hundred to several thousand times larger than that of the intermediate layer 12.

More specifically said thickness is preferably in a range of 1 to 100μ, more preferably 2 to 50μ.

In the photoconductive layer shown in FIG. 1, the amount of H or X (halogen atoms such as F) contained therein is preferably in a range of 1 to 40 atomic %, more preferably 5 to 30 atomic %.

The photoconductive member shown in FIG. 1 may be eventually provided, on the photosensitive layer 13, with a surface layer. Said surface layer can be composed, for example, of silicon carbide and can be formed by introducing suitable gasses such as $SiH_4$, $CH_4$ and $H_2$ or $SiH_4$ and $SiH_2(CH_3)_2$ into the activating space A to generate an active species with an excitation energy eventually combined with a catalyst and introducing said active species into the film forming space Said surface layer is preferably provided with a wide band gap, such as in a silicon nitride layer or a silicon oxide layer, and the film composition may be continuously changed from the photosensitive layer 13 to the surface layer. Such surface layer, if present, is preferably provided with a thickness of 0.01 to 5μ, more preferably 0.05 to 1μ.

The deposited films formed by the process of the present invention can be doped with impurity elements during or after the film formation. Examples of p-type dopant are elements in the group IIIA of the periodic table such as B, Al, Ga, In or Tl, while those of n-type dopant are elements in the group VA such as N, P, As, Sb or Bi, and particularly preferred ones are P, Sb, As, and the like.

For starting material for introducing such impurity, a materials are employed which are gaseous under normal temperature and pressure or are easily gasifiable at least under the film forming conditions. Specific examples of materials employable for the introduction of the impurity are $PH_3$, $P_2H_4$, $PF_3$, $PF_5$, $PCl_3$, $AsH_3$, $AsF_3$, $AsF_5$, $AsCl_3$, $SbH_3$, $SbF_5$, $BiH_3$, $BF_3$, $BCl_3$, $BBr_3$, $B_2H_6$, $B_4H_{10}$, $B_5H_9$, $B_5H_{10}$, $B_6H_{10}$, $B_6H_{12}$, $AlCl_3$, and the like.

Such impurity material may be activated either in the activating space A together with the material for generating the active species, or in another activating space B.

EXAMPLE 1

A-Si(H, X) deposited films of i-, p-, and n-type were prepared in the following operations by means of an apparatus shown in FIG. 3.

Figure 3:
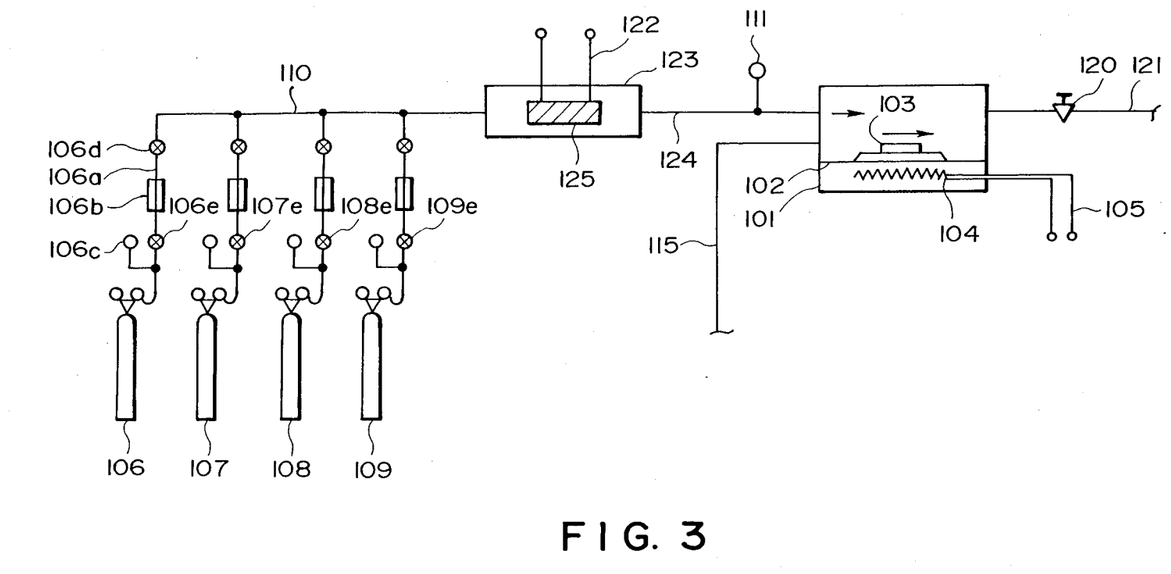
FIGS. 3 and 4 are schematic views of an apparatus for executing the process of the present invention employed in the foregoing embodiments.

In FIG. 3, a film forming chamber 101 is provided therein with a substrate support 102, for supporting a desired substrate 103.

A substrate heater 104, for heating the substrate 103 prior to the film formation or annealing the formed film for improving the characteristics thereof, is powered through a cable 105.

Gas sources 106–109 are provided according to the species of the film forming gas, eventually employed inert gas, and impurity-containing gas. Suitable gasifiers are provided if said gasses are liquid in the normal conditions.

In said gas sources 106–109, there are provided branch tubes a flow meters b, pressure gauges c for measuring the pressure at the high-pressure side of said flow meters, and valves d and e for regulating flow rate. An activating chamber A 123 is provided for generating the active species. A tungsten catalyst 125 formed into a honeycomb structure is heated by a current supplied through wires 122. The raw material for generating the active species, supplied through a gas inlet pipe 110, is activated in the activating chamber A under the function of the heated catalyst, and the resulting active species is introduced into the film forming chamber 101 through a pipe 124. There are also provided a gas pressure gauge 111, a discharge valve 120, and a discharge pipe 121.

At first, a substrate 103 of "Corning 7059" (produced by Corning Comp.) was placed on the support 102, and the film forming chamber 101 was evacuated to ca. $10^{-6}$ Torr with a vacuum pump. Then, a current was supplied through the cable 105 to heat the substrate 103 to a surface temperature of 300° C.

Then, the tungsten catalyst 125 of honeycomb form, placed in the activating chamber 125, was heated to red-hot state by an electric current supplied through the wires 122. Then, 50 SCCM of $H_2$ gas, or together with 40 SCCM of $PH_3$ or $B_2H_6$, diluted to 1000 ppm with hydrogen, was introduced from a gas container 106 into the activating chamber A 123 through the pipe 110. The hydrogen and other gases introduced into said chamber A 123 were activated with the tungsten catalyst in red-hot state to give active hydrogen etc. and introduced into the film forming chamber 101 through the pipe 124.

On the other hand, a silane compound $Si_4F_{10}$ was introduced from an unrepresented container, through a pipe 115, to generate a precursor $SiF_2^*$ on the surface of the substrate heated to 300° C. Said $SiF_2^*$ and the active hydrogen immediately caused chemical interaction to form a non-doped or doped A-Si(H, X) film of 700 Å thickness on the surface of the substrate, with a rate of 35 Å/sec. The pressure in the film forming chamber was maintained at 0.7 Torr.

The specimen with thus obtained non-doped or p-type A-Si(H, X) film was placed in a deposition chamber, and comb-shaped aluminum gap electrodes (gap length 250μ, width 5 mm) were formed under a pressure of $10^{-5}$ Torr. The properties of obtained films were evaluated by measuring the dark current at an applied voltage of 10 V and determining the dark conductivity $\sigma d$ with a microamperemeter (YHP 4140 B manufactured by YOKOKAWA HEWLETT-PACKARD Company). The film thickness was measured with a layer thickness measuring apparatus of Alpha-Step (manufactured by TENCOR Comp.) The results are summarized in Table 1.

EXAMPLE 2

A-Si(H, X) films were prepared in the same procedure as in the Example 1, except that the silane compound $Si_4F_{10}$ was replaced by a silane compound $Si_5H_2F_{10}$. Obtained results on the measured dark conductivity are summarized in Table 1. The film thickness and δd were measured in the same manner as used in Example 1. Table 1 indicates that the process of the prevent invention can provide an A-Si(H, X) film of excellent electrical properties and such film with sufficient doping.

TABLE 1

|  | Example 1 | Example 2 |
|---|---|---|
| Silane compound | $Si_4F_{10}$ | $Si_5H_2F_{10}$ |
| Substrate temp. | 300° C. | 300° C. |
| Gas for active species | $H_2$ | $H_2$ |
| Catalyst | W | W |
| σd (non-doped) $(\Omega cm)^{-1}$ | $5.0 \times 10^{-10}$ | $3.1 \times 10^{-10}$ |
| σd (B-doped) $(\Omega cm)^{-1}$ | $5.2 \times 10^{-9}$ | $2.8 \times 10^{-9}$ |
| σd (P-doped) $(\Omega cm)^{-1}$ | $7.1 \times 10^{-8}$ | $6.9 \times 10^{-8}$ |

EXAMPLE 3

A drum-shaped electrophotographic image forming member of a layer structure as shown in FIG. 1 was prepared in the following manner, with an apparatus shown in FIG. 4.

Figure 4:
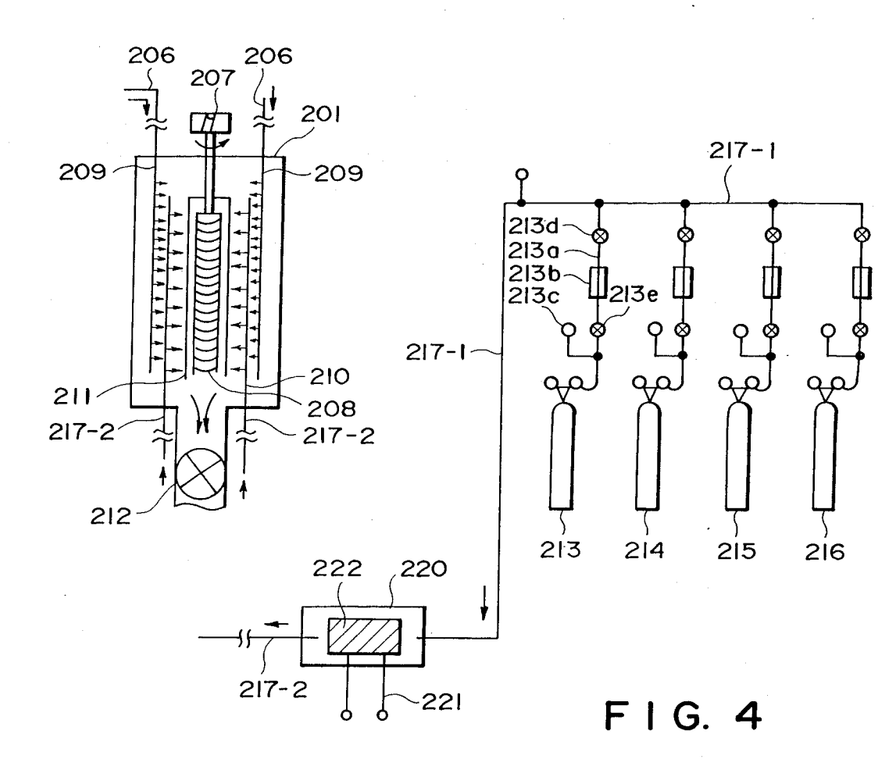

In FIG. 4, there are shown a film forming chamber 201, a silane compound introducing pipe 206, a motor 207, a heater 208 similar the heater 104 shown in FIG. 3, blow pipes 209 and 210, a cylindrical aluminum substrate 211, a discharge valve 212, gas sources 213–216 similar to those 106–109 shown in FIG. 3, and a gas inlet pipe 217-1.

The cylindrical aluminum substrate 211 was suspended in the film forming chamber 201, heated to 250° C. by the heater 208 provided therein and rotated by the motor 207.

A silane compound $Si_5F_{12}$ was introduced from an unrepresented container, through a pipe 206, into the film forming chamber 201, and activated on the surface of the heated substrate whereby the substrate was covered with the precursor $SiF_2^*$.

On the other hand, a tungsten catalyst 222 of honeycomb form, placed in the activating chamber A, was heated to a red-hot state by a current supplied through wires 221. Then, $H_2$ gas was introduced, through the pipe 217-1, into the activating chamber A 220 and transformed into active hydrogen by the function of the catalyst, and the active hydrogen was introduced into the film forming chamber 201 through an inlet pipe 217-2. Simultaneously, an impurity gas such as $PH_3$ or $B_2H_6$ was introduced into the activating chamber A 220 and activated if necessary.

The cylindrical aluminum substrate 211 was rotated, and the exhaust gas was discharged by suitably regulating the aperture of the discharge valve 212. The photosensitive layer 13 was prepared in this manner.

Also the intermediate layer 12 was prepared with a thickness of 2000 Å, by introducing a gaseous mixture $H_2/B_2H_6$, containing $B_2H_6$ in 0.2 vol. %, through the inlet pipe 217-1.

The film thickness and performances of the thus prepared member were measured in the same manner as used in Example 1.

REFERENCE EXAMPLE 1

An electrophotographic image forming member of a structure shown in FIG. 1 was prepared with $SiF_4$, $H_2$, and $B_2H_6$ through an ordinary plasma CVD process, in a film forming chamber which is similar to the chamber 201 except that it is provided with a high-frequency generator of 13.56 MHz.

The film thickness and performances of the thus prepared member were measured in the same manner as used in Example 1.

Table 2 summarizes the manufacturing conditions and performances of the electrophotographic image forming drums obtained in the Example 3 and the Reference Example 1.

TABLE 2

|  | Example 3 | Ref. Example 1 |
|---|---|---|
| Gas for precursor | $Si_5F_{12}$ | — |
| Substrate temp. | 250° C. | — |
| Main active species | $SiF_2^*$ | — |
| Amount introduced into film forming chamber | 100 SCCM | — |
| Gas for active species | $H_2$ | — |
| Catalyst | W | — |
| Amount from active. cham. A | 40 SCCM | — |
| Amounts from containers | — | $SiF_4$ 200 SCCM |
|  | — | $B_2H_6$ 100 SCCM |
|  | — | $H_2$ 100 SCCM |
| Pressure in film forming chamber | 0.9 Torr | 1.00 Torr |
| Film forming rate | 20 Å/sec | 6 Å/sec |
| Discharge power | — | 1.8 W/cm² |
| Thickness of photoses. layer 13 | 22μ | 22μ |
| Average number of defects in 10 drums | 3 | 14 |
| Potential fluctuation |  |  |
| in circumferential direc. | ±11 V | ±28 V |
| in axial direction | ±17 V | ±32 V |
| Note | Process of this invention | Conventional CVD substrate temperature 250° C. |

EXAMPLE 4

Figure 2:
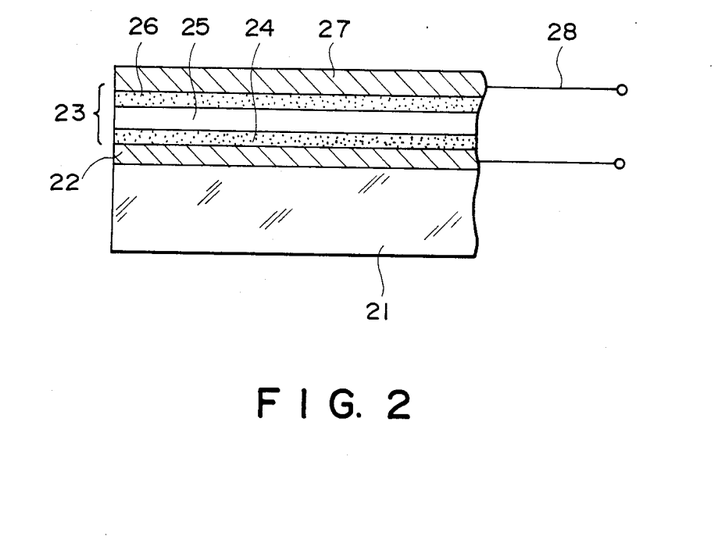
FIG. 2 is a schematic view of an example of a PIN diode obtained by the process of the present invention.

A PIN diode shown in FIG. 2 was prepared with the apparatus shown in FIG. 3.

At first a polyethylene terephthalate film 21, bearing a deposited ITO film 22 of 1000 Å, was placed on the support, and the chamber was evacuated to $10^{-6}$ Torr. Then, in the same manner as in the Example 1, $Si_4H_2F_8$ was introduced through the inlet pipe 116, and $H_2$ and $PH_3$ gases, diluted to 1000 ppm with hydrogen gas, were introduced through the inlet pipe 110, into the activating chamber A 123, and activated in the presence of a tungsten catalyst. Subsequently, thus activated gasses were introduced, through the inlet pipe 124, into the film forming chamber 101, and an n-type A-Si(H, X) film 24 doped with P of 700 Å thickness was formed at an internal pressure of 0.4 Torr in said film forming chamber 101.

Then, an i-type A-Si film 25 of 5000 Å thickness was prepared in the same procedure except that $PH_3$ gas was replaced by $B_2H_6$ gas diluted to 1000 ppm with hydrogen as.

Subsequently, a p-type A-Si(H, X) film 26 doped with B of 700 Å thickness was prepared in the same conditions as for the i-type film, except that diborane gas $B_2H_6$, diluted to 1000 ppm with hydrogen, was introduced together with $H_2$ gas. Then, an aluminum electrode 27 of 1000 Å thickness was formed by vacuum deposition on said p-type film to obtain the PIN diode.

The diode thus obtained (area 1 cm²) was subjected to the measurement of I-V characteristic to evaluate the rectifying and photovoltaic performances. The obtained results are summarized in Table 3.

Also light irradiation characteristic was measured by introducing light through the substrate, and, at a light intensity of ca. 100 mW/cm², there were obtained a conversion efficiency of 8.6% or higher, an open-end voltage of 0.94 V, and a shortcircuit current of 11 mA/cm$^2$.

The film thickness was measured in the same manner as used in Example 1.

EXAMPLE 5

A PIN diode was prepared in the same manner as in the Example 4, except that Si$_6$H$_2$F$_{12}$ gas was introduced from the inlet pipe 115 instead of Si$_4$H$_2$F$_8$ gas. Rectifying characteristic and photovoltaic property measured on this sample are shown in Table 3.

The film thickness was measured in the same manner as used in Example 1.

TABLE 3

|  | Example 4 | Example 5 |
|---|---|---|
| Silane for film forming | Si$_4$H$_2$F$_8$ | Si$_5$H$_2$F$_{12}$ |
| Substrate temp. | 260° C. | 240° C. |
| Rectify. ratio of diode (*1) | 8.0 × 10$^2$ | 6.3 × 10$^2$ |
| n value of diode (*2) | 1.2 | 1.3 |

(*1) Ratio of forward current to reverse current at 1 Vol.
(*2) n value (quality factor in a current equation of a p-n junction $$J = Js\left\{\exp\left(\frac{eV}{nRT}\right) - 1\right\}$$

Table 3 indicates that the present invention can provide a PIN diode of A-Si(H, X) films with optical and electrical properties superior to those obtainable with the conventional technology.

The film depositing process of the present invention can improve the electrical, optical, photoconductive, and mechanical properties of the deposited film, and is also capable of high-speed film forming without maintaining the substrate at a high temperature. Besides, it improves the reproducibility in film forming and the film quality, enables one to obtain uniform film quality, is suitable for forming a film of a large area, allows one to easily achieve mass production and to improve the film productivity. Also, since the precursor is generated by direct activation on the substrate, it is not necessary to employ separately an activation chamber for generating the precursor and it is made possible to save energy and to improve the efficiency of activation. Consequently, the consumption of the raw material gasses is significantly economized, and the film forming process is also simplified, so that a mass production with a low cost is rendered possible.

What we claim is:

1. A process for forming a deposited film comprising the steps of heating a substrate in a film-forming space; introducing a gaseous silane compound into the film-forming space; activating the silane compound on the surface of the heated substrate to generate a precursor functioning as a raw material for forming the deposited film; generating in a separate activating space an active species capable of interacting with the precursor; and introducing the active species into the film-forming space to thereby form a deposited film on the substrate without the use of external discharge energy in the film-forming space; said gaseous silane compound being a linear, branched or cyclic gaseous silane compound having the formula:

$$Si_xH_yX_z$$

wherein X is a halogen atom, x is 3, 4, 5 or 6; y and z are positive integers, and y+z=2x or 2x+2.

2. A process for forming a deposited film according to claim 1, wherein X is F or Cl.

3. A process for forming a deposited film according to claim 1, wherein y ranges $0 \leq y \leq 2x-2$ if y+z=2x.

4. A process for forming a deposited film according to claim 1, wherein y ranges $0 \leq y \leq 2x$ if y+z=2x+2.

5. A process for forming a deposited film according to claim 1, wherein y ranges $0 \leq y \leq 2x-4$ if y+z=2x.

6. A process for forming a deposited film according to claim 1, wherein y ranges $0 \leq y \leq 2x-2$ if y+z=2x+2.

* * * * *

UNITED STATES PATENT AND TRADEMARK OFFICE
CERTIFICATE OF CORRECTION

PATENT NO. : 4,830,890

DATED : May 16, 1989

INVENTOR(S) : MASAHIRO KANAI

Page 1 of 2

It is certified that error appears in the above-identified patent and that said Letters Patent is hereby corrected as shown below:

COLUMN 1

Line 18, "formation an" should read --the formation of an-- and "silicpn" should read --silicon--.
    Line 43, "the" should read --as to--.

COLUMN 2

Line 14, "point," should read --point, and--.
    Line 45, "formed" should read --form--.
    Line 65, "cohtrol" should read --control--.

COLUMN 3

Line 33, "$Si_xH_yX_2$" should read --$Si_xH_yX_z$--.

COLUMN 4

Line 18, "n" should read --in--.

COLUMN 6

Line 25, "of" should read --of a--.
    Line 26, "spac" should read --space--.

COLUMN 7

Line 29, "space" should read --space.--.
    Line 45, "a" should be deleted.

UNITED STATES PATENT AND TRADEMARK OFFICE
CERTIFICATE OF CORRECTION

PATENT NO. : 4,830,890

DATED : May 16, 1989

INVENTOR(S) : MASAHIRO KANAI

Page 2 of 2

It is certified that error appears in the above-identified patent and that said Letters Patent is hereby corrected as shown below:

COLUMN 9

Line 1, "prevent" should read --present--.

COLUMN 10

Line 53, "as." should read --gas.--.

COLUMN 12

Line 8, "What we claim is:" should read
--What I claim is:--.

Signed and Sealed this

Twenty-eighth Day of August, 1990

Attest:

HARRY F. MANBECK, JR.

*Attesting Officer*

*Commissioner of Patents and Trademarks*